(12) United States Patent
Toshima et al.

(10) Patent No.: US 8,465,596 B2
(45) Date of Patent: Jun. 18, 2013

(54) SUPERCRITICAL PROCESSING APPARATUS AND SUPERCRITICAL PROCESSING METHOD

(75) Inventors: Takayuki Toshima, Kumamoto (JP); Mitsuaki Iwashita, Yamanashi (JP); Kazuyuki Mitsuoka, Yamanashi (JP); Hidekazu Okamoto, Tokyo (JP); Hideo Namatsu, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 61 days.

(21) Appl. No.: 13/039,361

(22) Filed: Mar. 3, 2011

(65) Prior Publication Data

US 2011/0214694 A1 Sep. 8, 2011

(30) Foreign Application Priority Data

Mar. 5, 2010 (JP) .................. 2010-049567

(51) Int. Cl.
*B08B 5/00* (2006.01)
(52) U.S. Cl.
USPC .............. 134/21; 34/351; 34/405; 34/413; 216/2; 216/58; 438/52; 438/689; 438/706; 134/26; 134/30; 134/34; 134/35; 134/36; 134/42
(58) Field of Classification Search
USPC ............ 34/351, 405, 413; 216/2, 58; 438/52, 438/689, 706; 134/21, 26, 30, 34, 35, 36, 134/42
See application file for complete search history.

(56) References Cited

U.S. PATENT DOCUMENTS

| 7,749,909 | B2 * | 7/2010 | Tomita et al. ................. 438/694 |
| 8,056,257 | B2 * | 11/2011 | Ohno et al. ..................... 34/413 |
| 2008/0127508 | A1 * | 6/2008 | Ohno et al. ..................... 34/552 |
| 2009/0311874 | A1 * | 12/2009 | Tomita et al. ................. 438/759 |
| 2011/0000507 | A1 * | 1/2011 | Toshima et al. ................. 134/19 |
| 2011/0000512 | A1 * | 1/2011 | Toshima et al. ................. 134/34 |

FOREIGN PATENT DOCUMENTS

JP  2006-303316 A  11/2006

* cited by examiner

*Primary Examiner* — Bibi Carrillo
(74) *Attorney, Agent, or Firm* — Abelman, Frayne & Schwab

(57) ABSTRACT

Disclosed is a supercritical processing apparatus and a supercritical processing method for suppressing the pattern collapse or the injection of material constituting a processing liquid into a substrate. A processing chamber receives a substrate subjected to a processing with supercritical fluid, and a liquid supply unit supplies a processing liquid including a fluorine compound to the processing chamber. A liquid discharge unit discharges the supercritical fluid from the processing chamber, a pyrolysis ingredient removing unit removes an ingredient facilitating the pyrolysis of a liquid from the processing chamber or from the liquid supplied from the liquid supply unit, and a to heating unit heats the processing liquid including a fluorine compound of hydrofluoro ether or hydrofluoro carbon.

9 Claims, 13 Drawing Sheets

FIG. 5
(a)
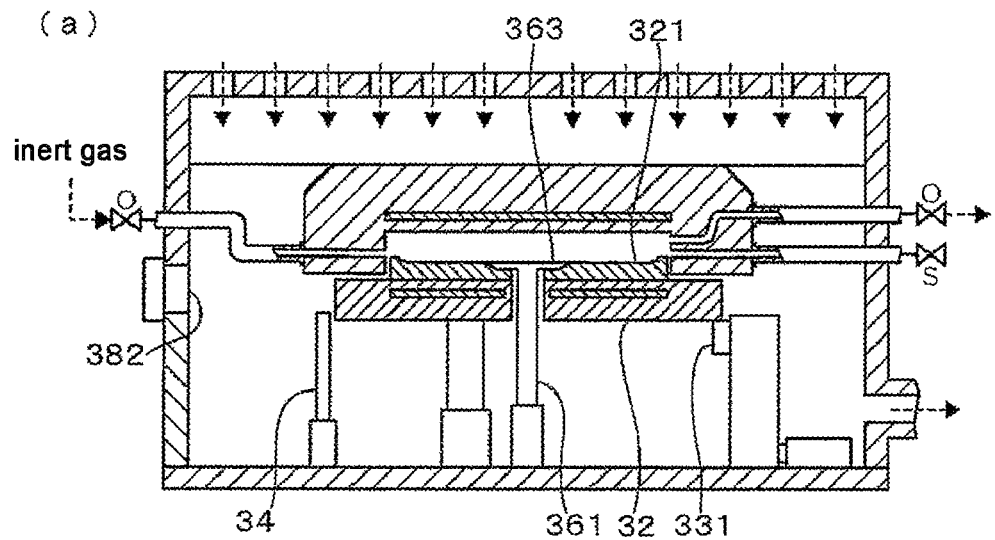
(b)
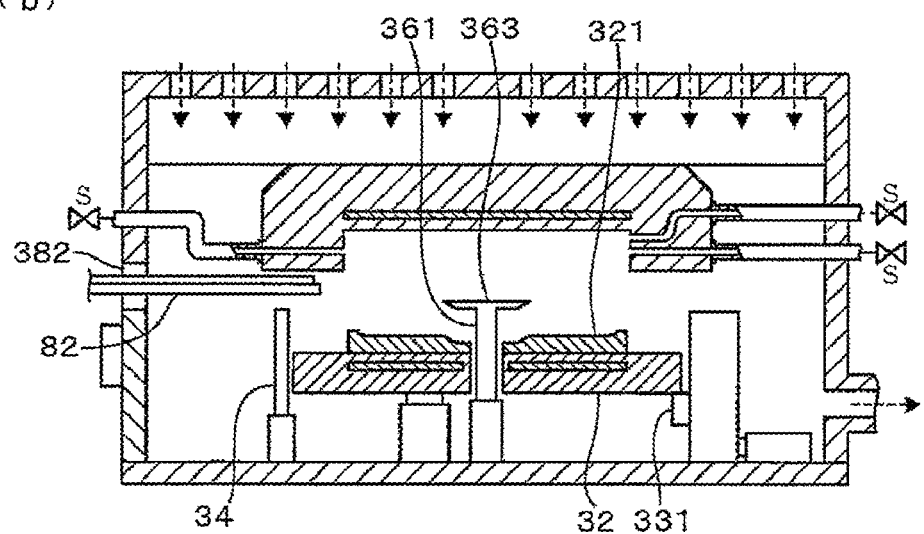

FIG.6
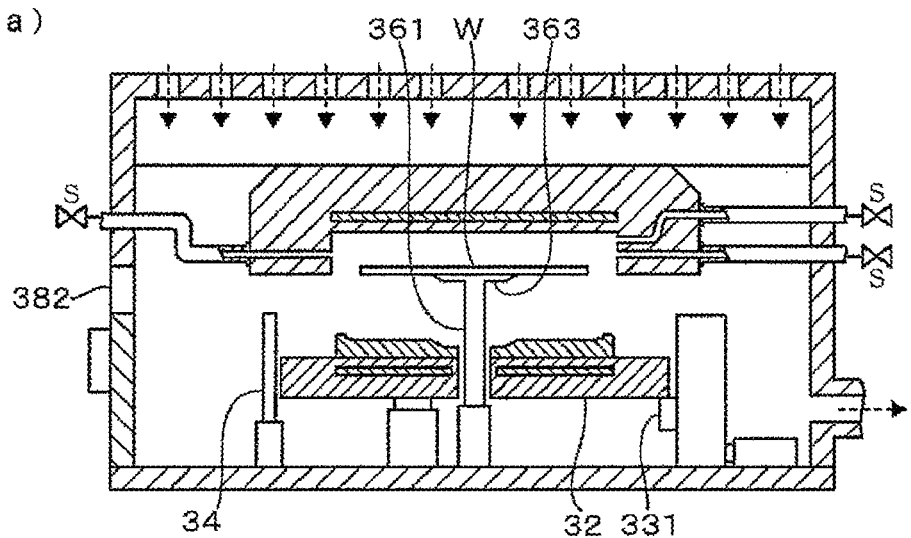
(a)
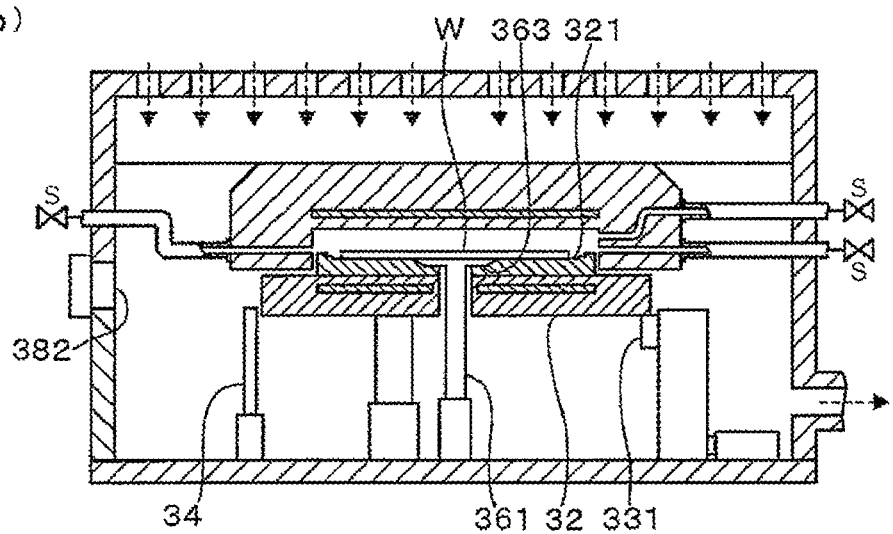
(b)

| | | | wafer unload | | wafer load | | |
|---|---|---|---|---|---|---|---|
| processing space atmosphere | supercritical HFE | discharge | inert gas | | open | substitution | supercritical HFE |
| case atmosphere | | | dried gas | | | | |
| processing space open/closing state | S | | O | S | O | | S |
| switching valve | — | — | inert gas | | — | HFE | — |
| V1 | S | S | O | | S | O | S |
| V2 | S | S | O | | S | O | S |
| V3 | S | O | S | | S | S | S |

V1 : blocking valve of HFE supply channel
V2 : blocking valve of HFE discharge line
V3 : blocking valve of HFE collection line
S : processing space of each blocking valve 「stop」
O : processing space of each blocking valve 「open」

(b)

| | | | wafer unload | wafer load | | |
|---|---|---|---|---|---|---|
| processing space atmosphere | supercritical HFE | discharge | open | open + inert gas | substitution | supercritical HFE |
| processing space open/closing state | S | | O | | S | |
| switching valve | — | — | — | inert gas | HFE | — |
| V1 | S | S | S | O | O | S |
| V2 | S | S | S | O | O | S |
| V3 | S | O | S | S | S | S |

| processing space atmosphere | supercritical HFE | discharge | open | inert gas | substitution | supercritical HFE |
|---|---|---|---|---|---|---|
| processing space open/closing state | S | | O | | S | |
| switching valve | — | — | — | inert gas | HFE | — |
| V1 | S | S | S | O | O | S |
| V2 | S | S | S | O | O | S |
| V3 | S | O | S | S | S | S |

↑ wafer unload   ↑ wafer load (b)

| processing space atmosphere | supercritical HFE | discharge | inert gas | open + inert gas | substitution | supercritical HFE |
|---|---|---|---|---|---|---|
| processing space open/closing state | S | | O | S | O | S |
| switching valve | — | — | inert gas | | HFE | — |
| V1 | S | S | O | | O | S |
| V2 | S | S | O | | O | S |
| V3 | S | O | S | | S | S |

↑ wafer unload   ↑ wafer load

FIG.10
(a) embodiment 1-1
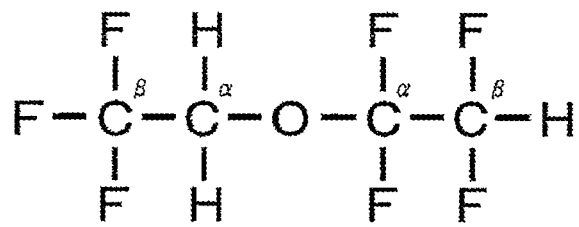
1,1,2,2-tetrafluoro-1-(2,2,2-trifluoroethoxy)ethane
(b) embodiment 1-2
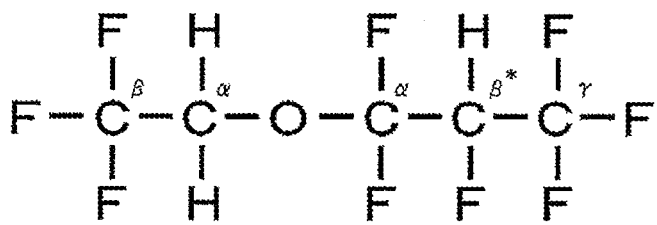
(1,1,2,3,3,3-hexafluro-1-(2,2,2-trifluoroethoxy)propane
(c) embodiment 1-3
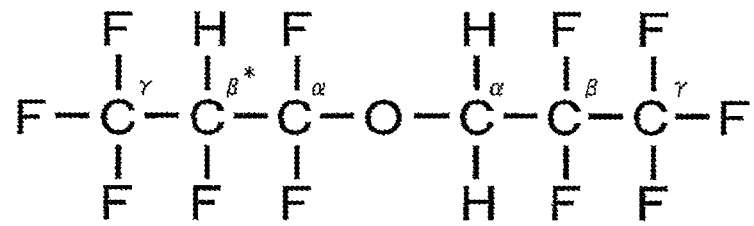
(1,1,2,3,3,3-hexafluro-1-(2,2,2-trifluoroethoxy)propane

FIG.11
(a) comparative example 1-1
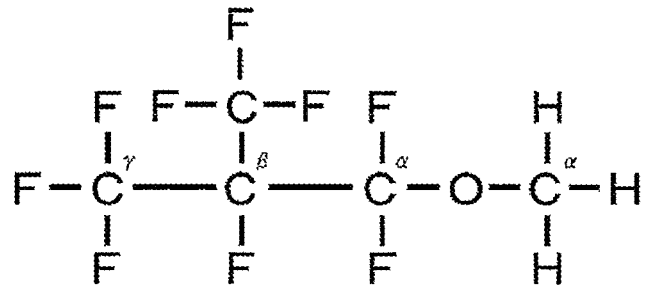
1,1,2,3,3,3-hexafluro-1-methoxy-2-trifluoromethylpropane
(b) comparative example 1-2
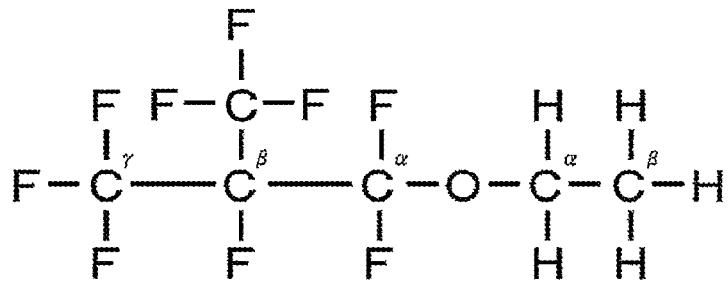
1,1,2,3,3,3-hexafluoro-1-ethoxy-2-trifluoromethylpropane
(c) comparative example 1-3
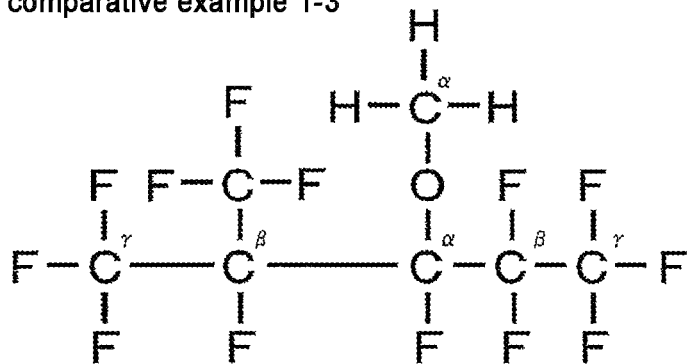
1,1,1,2,3,4,4,5,5,5-decafluoro-2-trifluoromethyl-3-methoxypentane

*FIG. 12*
(a)
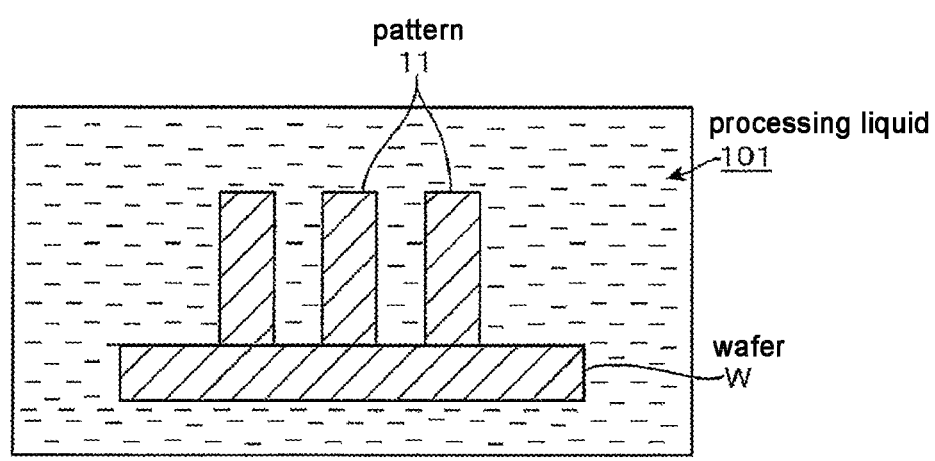
(b)
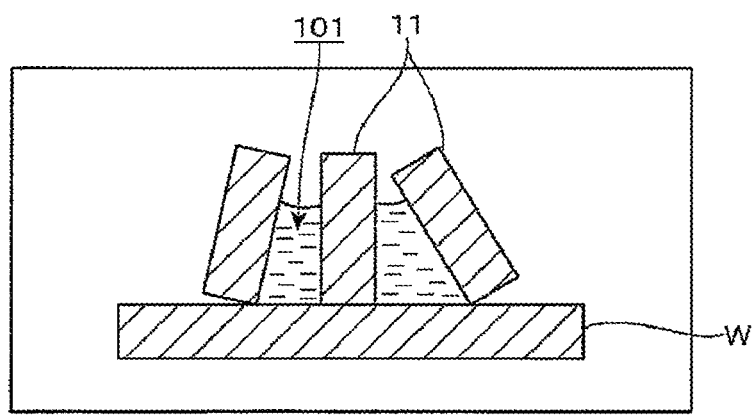

FIG. 13
(a)
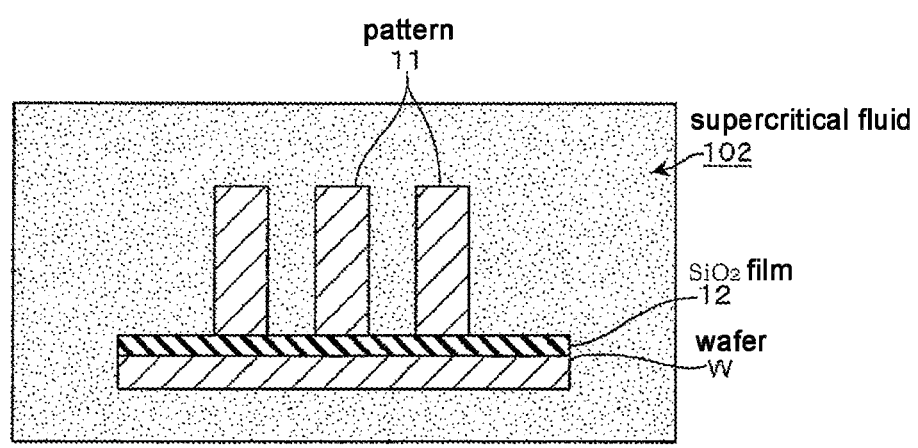
(b)
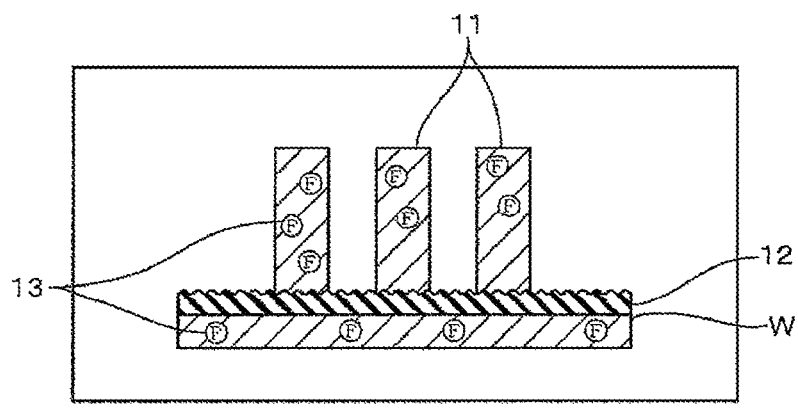

SUPERCRITICAL PROCESSING APPARATUS AND SUPERCRITICAL PROCESSING METHOD

This application is based on and claims priority from Japanese Patent Application No. 2010-049567, filed on Mar. 5, 2010, with the Japanese Patent Office, the disclosure of which is incorporated herein in its entirety by reference.

TECHNICAL FIELD

The present disclosure relates to a technology for processing a substrate, to such as a semiconductor wafer, formed with a pattern on a surface with a supercritical fluid.

BACKGROUND

In manufacturing of large-scale and high performance semiconductor devices including Large Scale Integrations (LSI) on a surface of a substrate, e.g., a semiconductor wafer (hereinafter, referred to as a "wafer"), it is necessary to form an ultra-fine pattern on the surface of the wafer. The pattern is formed by conducting a patterning process for the wafer coated with resist, which includes various processes such as an exposure process, a developing process, and a cleaning process. The wafer is then etched to transfer the resist pattern to the wafer, thereby forming the pattern on the surface of the wafer. After the etching process of the wafer, a cleaning process is performed in order to remove dusts or natural oxide films on the wafer.

In the cleaning process, for example, as schematically illustrated in FIG. 12A, a wafer W formed with a pattern 11 on a surface thereof is immersed in a processing liquid 101, such as a chemical liquid or a rinse liquid, or processing liquid 101 is supplied to the surface of wafer W. However, as the semiconductor devices are highly integrated, there occurs a problem of a pattern collapsing in which pattern 11 or the resist on the surface of the wafer collapses during a drying process of the processing liquid, after performing the cleaning process.

The pattern collapse refers to a phenomenon in which pattern 11 collapses toward the direction where larger quantity of processing liquid is remained when the processing liquid on left and right sides of pattern 11 is not uniformly dried after the cleaning process is completed, because the balance of the capillary force, which tensions pattern 11 in the left and right directions, is lost. FIG. 12B illustrates a state in which the processing liquid is dried on the outside regions of the left and right sides in which pattern 11 is not formed, while the processing liquid remains in the gap of pattern 11. As a result, pattern 11 on both the left and right sides collapses inwardly by the capillary force applied from the processing liquid left between patterns 11. The to pattern collapse is also a problem in the field of the MEMS (Micro-Electro-Mechanical System), which is manufactured by application of semiconductor manufacturing technology.

The capillary force that causes the pattern collapse is caused by the surface tension of the processing liquid applied in liquid/air interface between, for example, the atmosphere surrounding wafer W and the processing liquid left between patterns 11, after the cleaning process. Therefore, a processing method of drying the processing liquid (hereinafter, referred to as "a supercritical processing") by using fluid in a supercritical state (supercritical fluid) in which interface is not formed between gas and liquid has been attracting attention.

In the supercritical processing method, as illustrated in FIG. 13A, for example, liquid on a surface of wafer W is substituted with supercritical fluid 102 within a sealed chamber and then supercritical fluid 102 is gradually discharged from the chamber. As a result, the surface of wafer W is substituted in a sequence of processing liquid→supercritical fluid→air atmosphere, so that it is possible to remove the processing liquid on the surface of wafer W without forming the liquid/air interface, thereby preventing the generation of pattern collapse.

For the fluid used in the supercritical processing, carbon oxide, hydrofluoro ether (HFE), hydrofluoro carbon (HFC), etc. are used. However, carbon oxide in the supercritical state has low miscibility with the processing liquid, so that there may be a case in which the carbon oxide in the supercritical state makes it difficult to substitute the processing liquid with the supercritical fluid. In the meantime, a fluorine compound, such as HFE or HFC, is satisfactorily miscible with the processing liquid, but a part of the fluorine compounds is pyrolyzed at a high temperature and a high pressure in which the processing liquid becomes the supercritical state, so that there is a case in which, for example, the fluorine compound discharges fluorine atoms in a state of HF.

For example, as illustrated in FIG. 13A, in the event that an $SiO_2$ film 12 is to is formed on the surface of wafer W, when the fluorine atoms are emitted from the fluorine compound, there is a concern that $SiO_2$ film 12 is etched as illustrated in FIG. 13B. Further, the discharge of the fluorine atoms from the fluorine compound results in the deterioration of the property of the semiconductor device because the fluorine atoms may be injected into the semiconductor device of wafer W or pattern 11. Especially, when oxygen or moisture exists in the atmosphere in which the supercritical processing is performed, the oxygen or moisture becomes an ingredient facilitating the pyrolysis of the fluorine compound, so that $SiO_2$ film 12 may be easily etched or the fluorine atoms may be easily injected into the device.

Japanese Laid-Open Patent Publication No. 2006-303316 (e.g., paragraphs 0035 through 0038) discloses a technology in which a mixture liquid of HFE, such as $HCF_2CF_2OCH_2CF_3$, $CF_3CHFCF_2OCH_2CF_3$, and $CF_3CHFCF_2OCH_2CF_2CF_3$, is made in the supercritical state, the supercritical fluid is applied to a substrate processed with the cleaning process, and the substrate is dried. However, the disclosed technology does not take into account the problem of the discharge of the fluorine atoms from HFE.

SUMMARY

According to one embodiment, there is provided a supercritical processing apparatus, including: a sealable processing chamber in which a processing is performed on a substrate with a supercritical fluid; a liquid supply unit to supply a processing liquid including a fluorine compound to the processing chamber; a liquid discharge unit to discharge the supercritical fluid from the processing chamber; a pyrolysis ingredient removing unit to remove an ingredient facilitating the pyrolysis of liquid supplied from the processing chamber or from the liquid supply unit; and a heating unit to heat the liquid supplied to the processing chamber, wherein the fluorine to compound is hydrofluoro ether or hydrofluoro carbon.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a first view illustrating an operation of loading a wafer into the supercritical processing apparatus.

FIG. 6 is a second view illustrating the operation of loading a wafer into the supercritical processing apparatus.

FIG. 8 is a view illustrating an example of a timing of supply of inert gas to the supercritical processing apparatus.

FIG. 9 is a view illustrating another example of a timing of supply of inert gas to the supercritical processing apparatus.

FIG. 10 is a structural formula of HFE according to an embodiment.

FIG. 11 is a structural formula of HFE according to a comparative to example.

FIG. 12 is a view illustrating a phase of generation of pattern collapse.

FIG. 13 is a view illustrating a phase of a processing using supercritical fluid.

DETAILED DESCRIPTION

Figure 1:
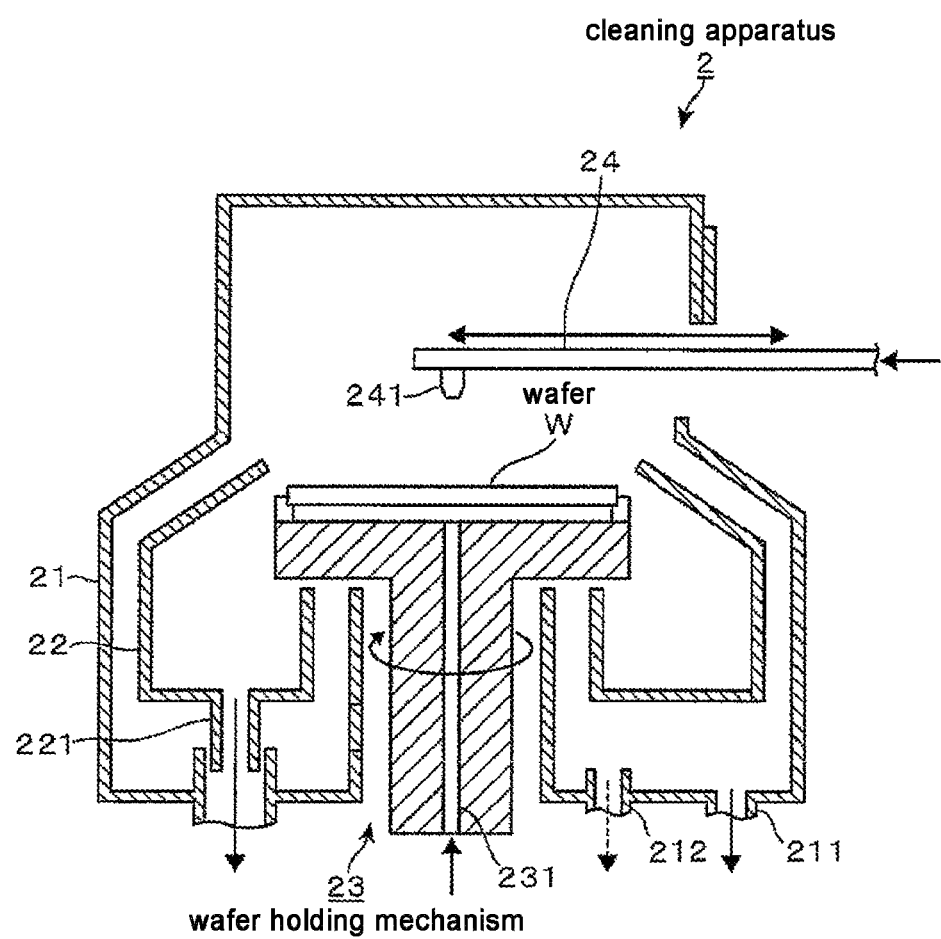
FIG. 1 is a vertical-sectional view illustrating an example of a wafer cleaning processing apparatus.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure has been made in consideration of the above problems, and provides a supercritical processing apparatus and a supercritical processing method which prohibit the generation of pattern collapse or the insertion of material forming a processing liquid into a substrate.

According to an embodiment of the present disclosure, the supercritical processing apparatus of the present disclosure includes: a sealable processing chamber in which a processing is performed on a substrate with a supercritical fluid; a liquid supply unit to supply a processing liquid including a fluorine compound to the processing chamber; a liquid discharge unit to discharge the supercritical fluid from the processing chamber; a pyrolysis ingredient removing unit to remove an ingredient facilitating the pyrolysis of the liquid from within the processing chamber or within a liquid supplied from the liquid supply unit; and a heating unit to heat the liquid supplied to the processing chamber, wherein the fluorine compound is hydrofluoro ether or hydrofluoro carbon.

The supercritical processing apparatus preferably includes the following characteristics.

(a) The pyrolysis ingredient removing unit includes a bubbling unit to supply inert gas to a processing liquid before the processing liquid is supplied from the liquid supply unit and to perform a bubbling process.

(b) The pyrolysis ingredient removing unit includes a first gas supply unit to supply inert gas to the processing chamber.

(c) In case (b) above, the supercritical processing apparatus includes a controller to control the pyrolysis ingredient removing unit so that the inert gas is supplied to the processing chamber before sealing of the processing chamber in order to remove an ingredient, which facilitates the pyrolysis of the processing liquid when the processing chamber is sealed after loading of the substrate, from the processing chamber.

(d) In case (b) or (c), the supercritical processing apparatus includes a controller to control the pyrolysis ingredient removing unit so that the inert gas is supplied to the processing chamber after completion of loading of the substrate into the processing chamber and sealing of the processing chamber, in order to remove an ingredient facilitating the pyrolysis of the processing liquid from the processing chamber.

(e) The processing chamber is received within a case in which the substrate is loaded and unloaded through a loading/unloading port, and the pyrolysis ingredient removing unit further includes a second gas supply unit to supply inert gas to the case in order to remove an ingredient facilitating the pyrolysis of the processing liquid from atmosphere surrounding the processing chamber.

(f) In cases (b) to (e), the inert gas is nitrogen gas having a dew point of −50° C. or lower.

(g) The fluorine compound is hydrofluoro ether consisting of a fluoroalkyl group including one or fewer carbon-carbon bond of a carbon atom to positioned at α location and two or fewer carbon-carbon bonds of a carbon atom positioned at β location when viewed from an oxygen atom.

(h) The fluorine compound includes at least one hydrofluoro ether selected from the group consisting of 1,1,2,2-tetrafluoro-1-(2,2,2-trifluoroethoxy)ethane, 1,1,2,3,3,3-hexafluoro-1-(2,2,2-trifluoroethoxy)propane, and 2,2,3,3,3-pentafluoro-1-(1,1,2,3,3,3-hexafluoropropoxy)propane.

According to another embodiment of the present disclosure, a supercritical processing method includes: loading a substrate formed with a pattern into a processing chamber; removing an ingredient facilitating the pyrolysis of a processing liquid from the processing chamber or the processing liquid including a fluorine compound supplied to the processing chamber; supplying the processing liquid to the processing chamber where the substrate is received; sealing the processing chamber and performing a processing for the substrate with a supercritical fluid obtained by heating a liquid supplied in the processing chamber; and discharging the supercritical fluid by opening the processing chamber, wherein the fluorine compound is hydrofluoro ether or hydrofluoro carbon.

Further, removing of the ingredient facilitating the pyrolysis of the processing liquid includes supplying inert gas to the processing liquid and performing a bubbling process.

Further, the removing of the ingredient facilitating the pyrolysis of the processing liquid includes supplying inert gas to the processing chamber.

Further, supplying supplies the inert gas to the processing chamber before the processing chamber is sealed after the substrate is loaded into the processing chamber, in order to remove the ingredient, which facilitates the pyrolysis of the processing liquid.

The supplying supplies the inert gas to the processing chamber after the to processing chamber is sealed after the substrate is loaded into the processing chamber, in order to remove the ingredient facilitating the pyrolysis of the processing liquid from the processing chamber.

Further, the processing chamber is received within a case in which the substrate is loaded and unloaded through a loading/unloading port, and supplying the inert gas further includes supplying inert gas to the case while the processing chamber is in an open state of the processing chamber in order to remove the ingredient facilitating the pyrolysis of the processing liquid from atmosphere surrounding the processing chamber.

Preferably, the inert gas is nitrogen gas having a dew point of −50° C. or lower.

Preferably, the fluorine compound is hydrofluoro ether consisting of a fluoroalkyl group including one or fewer carbon-carbon bond of a carbon atom positioned at α location and two or fewer carbon-carbon bonds of a carbon atom positioned at β location when viewed from an oxygen atom.

Preferably, the fluorine compound includes at least one hydrofluoro ether selected from the group consisting of 1,1,2,2-tetrafluoro-1-(2,2,2-trifluoroethoxy)ethane, 1,1,2,3,3,3-hexafluoro-1-(2,2,2-trifluoroethoxy)propane, and 2,2,3,3,3-pentafluoro-1-(1,1,2,3,3,3-hexafluoropropoxy)propane.

Accordingly, the present disclosure uses the fluorine compound, such as hydrofluoro ether (HFE) or hydrofluoro carbon (HFC), and removes a factor facilitating the pyrolysis of the fluorine compound from a processing system, so that it is possible to perform the supercritical processing under a condition in which the facilitation of a decomposition of the fluorine compound is difficult. Therefore, when the pattern is formed on the surface of the substrate, the present disclosure can control the generation of the pattern collapse and the injection of the fluorine atoms into the substrate, thereby to obtaining a high-quality processing result.

Hereinafter, as an embodiment of the present disclosure, a supercritical processing apparatus will be described, which removes processing liquids attached to a wafer after a cleaning process with a supercritical fluid of a fluorine compound, e.g. HFE. Prior to specifically describing a construction of the supercritical processing apparatus according to an embodiment of the present disclosure, a single-type cleaning apparatus will be briefly described, as an example of a cleaning process, which cleans wafers one by one by spin cleaning.

FIG. 1 is a vertical-sectional view illustrating a single-type cleaning apparatus 2. Single-type cleaning apparatus 2 holds a wafer W horizontally by a wafer holding mechanism 23 disposed within an outside chamber 21 forming a processing space and rotates wafer holding mechanism 23 around a vertical shaft, to rotate wafer W. Then, single-type cleaning apparatus 2 makes a nozzle arm 24 to enter an upper side of rotating wafer W and supplies a chemical liquid and a rinse liquid from a nozzle 241 installed at a front end of nozzle arm 24 in a preset sequence, to perform a cleaning process on a surface of wafer W. Further, a chemical liquid supply channel 231 is formed within wafer holding mechanism 23, so that the back surface of wafer W is cleaned by a chemical liquid and a rinse liquid supplied from chemical liquid supply channel 231.

The cleaning process is performed in a sequence of, for example, removal of particle or organic contaminants with SC1 liquid (a liquid mixture of ammonia and oxygenated water) of an alkali chemical liquid→rinsing of wafer W with deionized water (DIW) of a rinse liquid→removal of natural oxidized film with diluted hydrofluoric acid (DHF) of an acid chemical liquid→rinsing of wafer W with DIW. These liquids are received within an inside cup 22 disposed within outside chamber 21 or outside chamber 21, and are discharged from liquid discharge ports 221 and 211. Further, the atmosphere within outside chamber 21 is exhausted from a gas exhaust port 212.

A liquid, e.g., isopropyl alcohol (IPA), is supplied to the surface of wafer W for which the cleaning process is completed, in a state where the rotation of wafer holding mechanism 23 is stopped, so that the IPA is substituted with DIW left on wafer W. Further, for example, HFE, which is the same kind of HFE used in the supercritical processing apparatus to be described later, is supplied to the surface of wafer W, and the IPA is substituted with the HFE, so that the surface of wafer W is coated with the HFE liquid. Wafer W coated with the HFE liquid is then transferred to an outside carrying apparatus by a transfer mechanism (not shown) installed in wafer holding mechanism 23, so that wafer W is unloaded from cleaning apparatus 2.

DIW on the surface of wafer W is substituted temporarily with the IPA liquid, because the moisture facilitates the pyrolysis of HFE if moisture remains when the HFE enters into the supercritical state. Therefore, the moisture is removed from the surface of wafer as much as possible by substituting DIW with the IPA liquid, and then the IPA liquid is substituted with HFE, such that the amount of moisture introduced into the supercritical processing apparatus decreases as much as possible. Here, while alcohol, such as IPA, still has an effect facilitating the pyrolysis of HFE in the supercritical state, such a facilitating action is insignificant in comparison with the effect of the moisture. Further, for example, when a sufficient quantity of HFE can be used for removing DIW, the substitution of DIW with IPA may be omitted and DIW of the surface of wafer W may be substituted with HFE directly.

After completing the cleaning process in cleaning apparatus 2, Wafer W is carried to the supercritical processing apparatus while the surface thereof is coated with HFE, and a supercritical processing is performed to remove the processing liquid attached to the surface of the wafer. Hereinafter, a construction of a supercritical processing apparatus 3 will be described with reference to FIGS. 2 and 3, according to an embodiment.

Supercritical processing apparatus 3 includes an upper chamber 31 and a bottom plate 32 of upper chamber 31 in which the supercritical processing is performed for wafer W. Supercritical processing apparatus 3 further includes a mechanism for storing wafer W within upper chamber 31, and a mechanism for supplying HFE of a processing liquid to upper chamber 31 and inducing HFE to enter into the supercritical state.

Upper chamber 31 and bottom plate 32 correspond to a processing chamber according to the present embodiment, and the supercritical processing is performed in the processing chamber by storing wafer W and removing liquid (HFE coated in cleaning apparatus 2 in the present embodiment) attached to the surface of wafer W by using HFE in the supercritical state. Upper chamber 31 is a pressure-resistant chamber shaped like a flat disk, in which a concave portion is formed at the lower surface thereof forming a processing space 30 for the supercritical processing for wafer W, and is made of, for example, stainless steel. The concave portion formed on the lower surface of upper chamber 31 is shaped like, for example, a flat disk, and is combined with a disposition board 321 of wafer W to be described later, so that processing space 30 for storing wafer W having a diameter of 300 mm is formed between upper chamber 31 and bottom plate 32. Upper chamber 31 may be metal coated by gold, platinum, Teflon (registered trademark)-coated, resin-coated by polyimide or ETHOXY resin, so that the emission of fluorine atoms from HFE can be suppressed.

Figure 2:
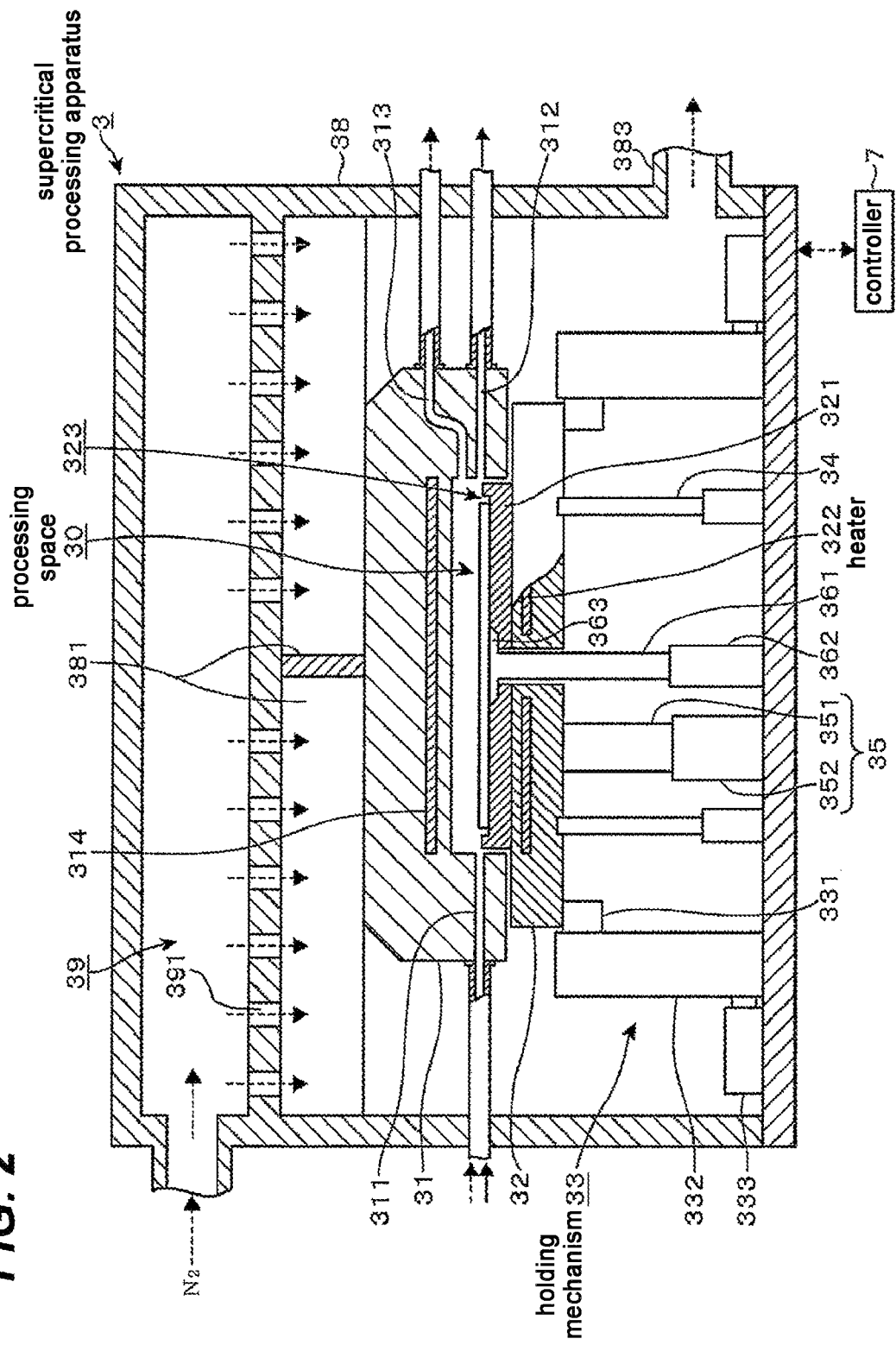
FIG. 2 is a vertical-sectional view illustrating a supercritical processing apparatus according an embodiment.

As illustrated in FIG. 2, upper chamber 31 includes three flow channels 311, 312, and 313 opened toward the side face of processing space 30. Reference number 311 denotes an HFE supply channel for supplying HFE of a processing liquid to processing space 30 in a liquid state, reference number 312 denotes an HFE discharge channel for discharging supercritical HFE from processing space 30, and reference number 313 denotes a discharge channel for discharging atmosphere within processing space 30 from processing space 30 before and after the processing.

Figure 3:
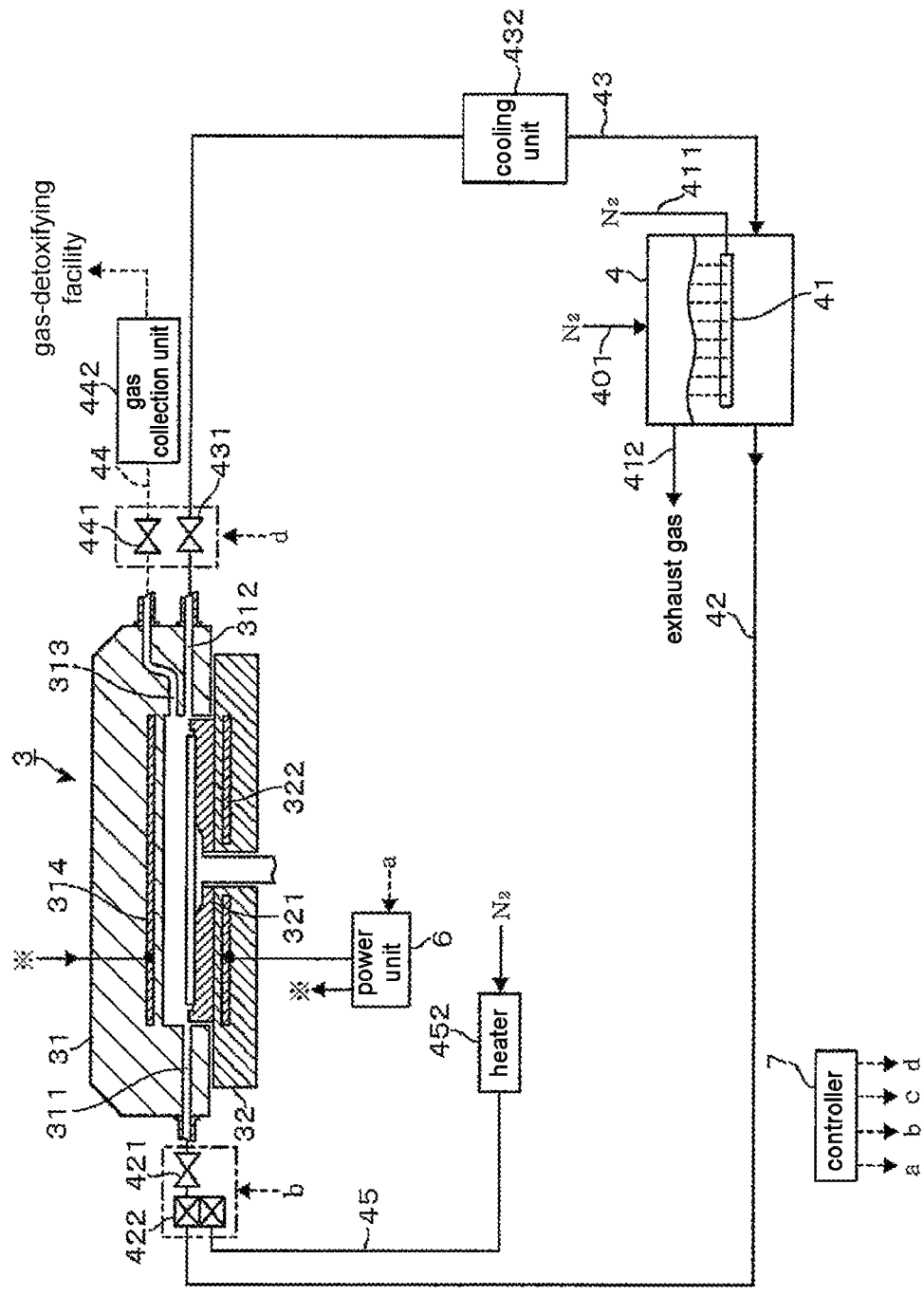
FIG. 3 is a view illustrating a system of supply and discharge of a processing liquid and inert gas for the supercritical processing apparatus.

As illustrated in FIG. 3, HFE supply channel 311 is connected to an HFE supply unit 4 through an HFE supply line 42 provided with a blocking valve 421. Each device from HFE supply unit 4 to HFE supply channel 311 corresponds to a liquid supply unit for supplying HFE to processing space 30 (within the processing chamber) according to the present embodiment. Further, HFE discharge channel 312 is connected to HFE supply unit 4 through an HFE collection line 43 provided with a blocking valve 431 and a cooling unit 432, and can recycle HFE. Cooling unit 432 cools down HFE discharged from processing space 30, for example, in the supercritical state or a gaseous state, and collects HFE in a liquid state. Each device from HFE discharge channel 312 to HFE supply unit 4 corresponds to a fluid discharge unit of the present embodiment.

HFE supply unit 4 is provided with a pressurized gas supply line 401 for carrying pressurized HFE toward the processing chamber. Pressurized gas supply line 401 supplies the pressurized carrier gas, such as nitrogen gas, to a reservoir forming HFE supply unit 4 in a state where an exhaust line 412 is closed by, for example, an opening/closing valve (not shown), so that the inside HFE can be delivered to the processing chamber. Descriptions for exhaust line 412 will be followed. The supply amount of HFE can be controlled, for example, by increasing or decreasing the quantity of nitrogen gas supplied from carrier gas supply line 401. Here, a method of supplying HFE to the processing chamber is not limited to the use of the pressurized gas, and it is acceptable to install a liquid feeding pump in HFE supply line 42 and supply HFE through the liquid feeding pump.

Further, an outlet side of discharge channel 313 is connected to a discharge line 44 via a blocking valve 441 and a gas collection unit 442, and discharge line 44 is connected to, for example, a detoxifying facility of a factory. Gas collection unit 442 is formed with, for example, an absorption column filled with activated carbon, thereby absorbing HFE included in the gas discharged from processing space 30. HFE adsorbed to the activated carbon can be collected by, for example, passing steam that passes through gas collection unit 442 in a state where gas collection unit 442 is off-line to with respect to discharge line 44, and desorbing HFE from the activated carbon, so as to cool the steam.

As described above, in the present embodiment, it is exemplified that HFE supply channel 311, HFE discharge channel 312, and discharge channel 313 are installed in a side of HFE supply channel 311, but these channels 311, 312, and 313 can be installed at the side of bottom plate 32 as a matter of choice.

As illustrated in FIG. 2, upper chamber 31 is fixed to an upper surface of case 38, which includes a pressing member 381 shaped like a cantilever that is crossed in a cross shape and receives the entire upper chamber 31. Pressing member 381 resists against the force applied from the supercritical fluid within processing space 30 and presses upper chamber 31 downwardly.

Bottom plate 32 closes the concave portion of upper chamber 31 in a lower side, forming processing space 30 for receiving and holding wafer W. Bottom plate 32 is made of, for example, stainless steel, and is formed with, for example, a round plate-shaped member larger than the opened surface of the concave portion of upper chamber 31. Disposition board 321, which is shaped like a round plate capable of being assembled within the concave portion of upper chamber 31 and is made of, for example, stainless steel, is fixed to an upper surface of bottom plate 32. As illustrated in FIG. 2, a concave portion constituting a disposition area 323 of wafer W is formed at the upper surface of disposition board 321.

Further, bottom plate 32 can be moved up and down by a bottom plate elevating mechanism 35 including a support pole 351 and a driving mechanism 352 of support pole 351, and can move between a lower transfer position at which a carrying apparatus (not shown) transfers wafer W subjected to the cleaning process by cleaning apparatus 2 to bottom plate 32, and a processing position at which wafer W is subjected to a supercritical processing in processing space 30 formed by closing the concave portion of upper chamber 31.

Reference number 34 of FIG. 2 denotes a guide member guiding an to elevating orbit of bottom plate 32 in an elevation operation, and for example, guide members 34 are arranged at, for example, three locations with substantially identical interval along the circumference of bottom plate 32.

Here, the pressure within processing space 30 where the supercritical processing is being performed, is in such a high pressure, for example, an absolute pressure equivalent to 3 MPa, and a large downward force is applied to bottom plate 32. Therefore, a support mechanism 33 for supporting a bottom surface of bottom plate 32 is installed at the lower side of bottom plate 32. Supporting mechanism 33 includes a supporting member 331 for supporting the bottom surface of bottom plate 32, sealing processing space 30 and elevating in accordance with an elevating movement of bottom plate 32, a guide member 332 for guiding an alleviation orbit of supporting member 331, and a driving mechanism 333 including, for example, a hydraulic pump. Supporting mechanism 33, similar to aforementioned guide member 34, is arranged at, for example, three locations in a substantially identical interval along the circumference of bottom plate 32.

A lifter 361 is installed at the center of bottom plate 32 for transferring wafer W to the outside carrying device. Lifter 361 passes through the substantially center area of bottom plate 32 and disposition board 321 in a vertical direction, a round plate-shaped wafer holding unit 363 is fixed to the upper end of lifter 361 for horizontally holding wafer W, and a driving mechanism 362 of lifter 361 is installed at the lower end of lifter 361.

Disposition board 321 includes a concave portion for storing wafer holding unit 363 formed at the center of an upper surface thereof, and by independently elevating lifter 361 from bottom plate 32, wafer holding unit 363 protrudes and depresses from bottom plate 32 so that it is possible to transfer wafer W between the outside carrying device and disposition area 323 on bottom plate 32. Here, as illustrated in FIG. 2, when wafer holding unit 363 is stored within the concave part of bottom plate 32, an upper surface of wafer holding unit 363 is identical to that of disposition board to 321 serving as disposition area 323.

Further, a heater 322 is laid in an inside of bottom plate 32. Heater 322 includes, for example, a resistive heating element for increasing the temperature of HFE supplied to processing space 30 to, for example, 200° C., increasing the pressure of processing space 30 to, for example, 3 MPa by the expansion of the HFE fluid, and inducing the processing liquid to enter into the supercritical state. As illustrated in FIG. 3, heater 322 is connected to a power unit 6 and generates heat by power supplied from power unit 6, so that it is possible to heat HFT within processing space 30 through disposition board 321 and wafer W arranged on the upper surface of disposition board 321. Heater 322 corresponds to a heating unit of the present embodiment.

In order to suppress the discharge of the fluorine atoms by the pyrolysis of HFE as described in the background art, supercritical processing apparatus 3 including the aforementioned construction according to the present embodiment adopts a special construction for eliminating the ingredient facilitating the pyrolysis of HFE from both sides of HFE used as fluid for the supercritical processing and the apparatus.

Prior to specifically describing the construction of an apparatus installed for eliminating the ingredient facilitating the pyrolysis of HFE, the relation between fluorine compounds, such as HFE or HFC, and an ingredient facilitating the pyrolysis of the fluorine compound will be described.

A liquid of a fluorinated compound having no risk of flammability and low toxicity includes hydrofluoro ether (constituting with carbon, hydrogen, fluorine, and ether oxygen, and having a COC bond) and hydrofluoro carbon (constituting with carbon, hydrogen, and fluorine). Hydrofluoro ether includes, for example, $CF_3CF_2CH_2OCHF_2$, $CF_3CF_2OCH_2CF_3$, $C_3F_7OCH_3$, $C_4F_9OCH_2CH_3$, $(CF_3)_2CFCF(OCH_3)CF_2CF_3$, $CHF_2CF_2OCH_2CF_3$, $CF_3CHFOCHF_2$, etc. and hydrofluoro carbon includes, for example, $C_4F_9H$, $C_5F_{11}H$, $C_6F_{13}H$, $C_4F_9CH_2CH_3$, $C_6F_{13}CH_2CH_3$, $CF_3CH_2CF_2CH_3$, $c\text{-}C_5F_7H_3$, $CF_3CF_2CHFCHFCF_3$, $CF_3CH_2CHF_2$, etc., and they are liquid at a normal temperature and pressure. Further, the fluorine compounds are to materials having a short atmospheric lifetime of several years (perfluorocarbon generally has an atmospheric lifetime of 1000 to 50,000 years) and having no environmental problem. When the hydrofluoro ether or hydrofluoro carbon is present under a predetermined temperature and pressure, the fluorine compounds enter into the supercritical state, and then by decreasing the pressure to air pressure, it is possible to perform the supercritical processing of drying wafer W after the liquid processing is performed.

Examples of commercially available hydrofluoro ether (fluoroalkyl chain is $C_6$ or fewer), which is easy to use because having a boiling point of 50° C. or higher and a critical temperature of about 200° C. or lower, include those shown in Table 1.

TABLE 1

Boiling point and critical point (critical temperature, critical pressure) of representative hydrofluoro ether

| Molecular structure | Boiling point (° C.) | Critical temperature (° C.) | Critical pressure (atm) |
|---|---|---|---|
| $C_4F_9OCH_3$ | 61 | 185 | 19.5 |
| $C_4F_9OCH_2CH_3$ | 76 | 198 | 18.2 |
| $(CF_3)_2CFCF(OCH_3)CF_2CF_3$ | 98 | 211 | 13.9 |
| $CF_3CH_2OCF_2CHF_2$ | 56 | 188 | 23.4 |
| $CF_3CH_2OCF_2CHFCF_3$ | 73 | 197 | 22.2 |
| $CF_3CHFCF_2OCH_2CF_2CF_3$ | 88 | 203 | 18.5 |

In order to make any hydrofluoro ether to become the supercritical state, it is necessary to increase the temperature to at least 185° C., and close to 200° C.

Further, hydrofluoro carbon, which especially has a boiling point of 50° C. or higher and has been put on the market, is represented in Table 2.

TABLE 2

Boiling point and critical point (critical temperature, critical pressure) of representative hydrofluoro carbon

| Molecular structure | Boiling point (° C.) | critical temperature (° C.) | critical pressure (atm) |
|---|---|---|---|
| $C_6F_{13}H$ | 71 | 188 | 15.7 |
| $C_4F_9CH_2CH_3$ | 68 | 195 | 18.6 |
| $C_6F_{13}CH_2CH_3$ | 114 | 233 | 14.1 |

TABLE 2-continued

Boiling point and critical point (critical temperature, critical pressure) of representative hydrofluoro carbon

| Molecular structure | Boiling point (° C.) | critical temperature (° C.) | critical pressure (atm) |
|---|---|---|---|
| $c\text{-}C_5F_7H_3$ | 83 | — | — |
| $CF_3CF_2CHFCHFCF_3$ | 55 | 181 | 22.6 |

While there is a hydrofluoro carbon of which the critical temperature has not been identified among the hydrofluoro carbons represented in Table 2, the critical temperature of most hydrofluoro carbons is around 200° C., similar to the hydrofluoro to ethers represented in Table 1.

It has been known that the liquid of the fluorine compound represented by hydrofluoro ether or hydrofluoro carbon generally has a high thermo-stability, but it can be noted that acid contents, even though they are very small amount, are generated by an oxidation process under the existence of oxygen in a temperature range (around 200° C.) where the supercritical state is achieved used in the present embodiment. In the meantime, when an identical process is actually performed while oxygen is not presented, the generation of the acid contents is not observed at all, indicating that the oxidation decomposition does not occur.

Therefore, as a preliminary experiment, a thermo-stability test was performed with respect to hydrofluoro ethers or hydrofluoro carbons represented in Table 3. The thermo-stability test was performed by filling a pressure resistant chamber made of SUS-304 with a sample of the liquid of hydrofluoro ether and the liquid of hydrofluoro carbon at 200° C. for 72 hours under the conditions represented in Table 3. The chamber was filled with the sample, a quantity of which is smaller than the total volume of the chamber, so as to form a vapor atmosphere within the pressure-resistant chamber. Then, the test was performed under two conditions including a vapor atmosphere containing about 20 vol % oxygen and a vapor atmosphere containing an oxygen with a concentration of 50 vol ppm or less (all remaining portions are nitrogen gas). Further, for various kinds of fluorine compounds used as the sample of the thermo-stability test, the quantity of dissolved oxygen was reduced up to the degree as shown in Table 3 by bubbling argon gas within the sample liquid.

A result of evaluation of acid contents and increment of F ions is represented in Table 3. The acid contents and the increment of F ions are obtained by measuring pH of extracted water and the concentration of fluorine ion, through an operation of extracting the sample after the test with an identical quantity of water.

TABLE 3

Result of thermo-stability test

| Fluorine compound | Concentration of moisture within sample (prior to test) | Concentration of oxygen within atmosphere | pH after test | Concentration of F ion after test (lowest limit of detection is 0.5 ppm) |
|---|---|---|---|---|
| $CH_3CH_2OCF_2CHF_2$ | Saturation | 20% | 3~4 | 0.5 ppm or less |
| $CF_3CH_2OCF_2CHF_2$ | Saturation | <50 ppm | 7 | 0.5 ppm or less |
| $CF_3CH_2OCF_2CHF_2$ | <50 ppm | 20% | 3~4 | 0.5 ppm or less |
| $CF_3CH_2OCF_2CHF_2$ | <50 ppm | <50 ppm | 7 | 0.5 ppm or less |
| $C_4F_9OCH_3$ | Saturation | 20% | 2~3 | 2~10 ppm |
| $C_4F_9OCH_3$ | Saturation | <50 ppm | 5~6 | 0.5 ppm or less |

TABLE 3-continued

Result of thermo-stability test

| Fluorine compound | Concentration of moisture within sample (prior to test) | Concentration of oxygen within atmosphere | pH after test | Concentration of F ion after test (lowest limit of detection is 0.5 ppm) |
|---|---|---|---|---|
| $C_4F_9OCH_3$ | <50 ppm | 20% | 2~3 | ~1 ppm |
| $C_4F_9OCH_3$ | <50 ppm | <50 ppm | 6~7 | 0.5 ppm or less |
| $C_6H_{13}H$ | <50 ppm | 20% | 4~5 | 0.5 ppm or less |
| $C_6F_{13}H$ | <50 ppm | <50 ppm | 7 | 0.5 ppm or less |

According to the result of Table 3, (1) regardless of the moisture concentration value, when the oxygen concentration is low within the atmosphere, the pH value is about 7 so that the generation of the acid contents is suppressed, (2) when the oxygen concentration in $CF_3CH_2OCF_2CHF_2$ and $C_6F_{13}H$ is 50 ppm or less, the pH value is about 7 and the generation of the acid contents is not observed, and (3) when the oxygen concentration $C_4F_9OCH_3$ is 50 ppm or less, while the generation of the acid contents is suppressed, the pH value is from 6 to 7, so that it can be noted that the generation of the acid contents is not completely suppressed.

According to the result of the thermo-stability test, the oxygen concentration may be decreased within the vapor atmosphere in order to suppress the generation of HF (the acid contents). It is considered that when the oxygen concentration is high within the vapor atmosphere, the oxygen is dissolved into the liquid of the fluorinated compound, so that the oxidation of the fluorinated liquid is facilitated. Therefore, it is important to decrease the dissolved oxygen of the liquid itself of the fluorinated compound and decrease the oxygen within the processing atmosphere in the processing chamber.

Further, because each of the aforementioned fluorine compounds is expensive, the fluorine compounds are collected by, for example, aforementioned gas collection unit 442 in an activated carbon absorption type as shown in FIG. 3, so that the discharge of the fluorine compounds to the environment is suppressed. The fluorine compounds collected by the activated carbon are collected by a steam desorption. Therefore, in order to investigate the thermo-stability of the fluorine compound in the stream desorption processing, the thermo-stability was evaluated in the heat treatment at 120° C. for 72 hours under the existence of the activated carbon by analyzing the acid contents and the F ion mass after the test.

As a result, as illustrated in an embodiment to be described later, it was identified that the acid contents of 160 ppm, the F ion mass of 45 ppm, and HF by the dissolution were generated in $C_4F_9OCH_3$. In the meantime, it was identified that $CF_3CH_2OCF_2CHF_2$ (FIG. 10A), $CF_3CH_2OCF_2CHFCF_3$ (FIG. 10B), and $CF_3CHFCF_2OCH_2CF_2CF_3$ (FIG. 10C) were difficult to be dissolved, and for example, it was identified that both of the acid contents and the F ion mass were equal to or less than a detection limit (1 ppm of acid contents, 0.02 ppm of F ion mass) in the stability test under the same condition (120° C.) described above.

$C_4F_9OCH_3$ used in the aforementioned thermo-stability test is the mixture of $(CF_3)_2CFCF_2OCH_3$ (FIG. 11A) having a branched structure and $CF_3CF_2CF_2CF_2OCH_3$ having a straight-chain structure. However, it is presumed that the reason why the generation of HF in $C_4F_9OCH_3$ has been identified is that $C_4F_9OCH_3$ includes $(CF_3)_2CFCF_2OCH_3$ in which the carbon within the fluoroalkyl chain positioned at α position or β position of ether oxygen has a branched structure, and thus the fluorine atom combined with the branched carbon is easily separated as HF. Hydrofluoro ether from which HF is easily separated is not limited to what is represented in FIG. 11A, and it can be noted that, for example, the hydrofluoro ether shown in FIG. 11B or FIG. 11C, in which the carbon within the fluoroalkyl chain positioned at α position or β position of ether oxygen has the branch structure, is also dissolved so that HF is easily emitted.

In comparison of the chemical structures between hydrofluoro ether illustrated in FIGS. 10A to 10C suitable for the critical processing and easily pyrolyzed hydrofluoro ether illustrated in FIGS. 11A to 11C, it can be noted that in the easily pyrolyzed hydrofluoro ether, a hydrofluoro group is branched to the carbon atom positioned at α position or β position as viewed from the oxygen atom on at least one side of each fluoroalkyl group combined with the oxygen atom.

In contrast, the hydrofluoro ether illustrated in FIGS. 10A to 10C, which is stable in the supercritical state, does not have the branch and the hydrofluoro group has the straight-chain shape in both of the carbon atoms at α position and β position, as viewed from the oxygen atom. In expressing the hydrofluoro ether with the number of carbon-carbon bonds of the carbon atom at each position, the thermo-stable hydrofluoro ether is formed with the fluoroalkyl group including one or fewer (including zero) carbon-carbon bond of the carbon atom positioned at α position and two or fewer (including zero) of carbon-carbon bonds of the carbon atom positioned at β position, as viewed from the oxygen atom. Further, the hydrofluoro ether having the above structure is difficult to be dissolved in the supercritical state or in the steam desorption from the activated carbon, so that it can be considered that hydrofluoro ether is suitable for the supercritical processing according to the present embodiment.

Among $CF_3CH_2OCF_2CHF_2$, $CF_3CH_2OCF_2CHFCF_3$, and $CF_3CHFCF_2OCH_2CF_2CF_3$ which are difficult to be pyrolyzed, $CF_3CH_2OCF_2CHF_2$(1,1,2,2-tetrafluoro-1-(2,2,2-trifluoroethoxy)ethane) has the lowest critical point, so that the hydrofluoro ether can be easily used. Hereinafter, it is assumed that $CF_3CH_2OCF_2CHF_2$ is supplied from HFE supply unit 4 in supercritical processing apparatus 3 according to the present embodiment will be described.

According to the result of the above investigation, the dissolved oxygen is removed from the liquid or the oxygen is removed from the processing atmosphere in which the supercritical processing is performed by using the liquid of the fluorine compounds which are difficult to be pyrolyzed (HFE in supercritical processing apparatus 3 according to the embodiment), so that the pyrolysis of HFE is suppressed, thereby suppressing the generation of a problem of etching of wafer W by HF separated from HFE or injection of the fluorine atoms into a semiconductor device.

Prior to describing the specific construction installed in supercritical processing apparatus 3 according to the present embodiment for suppressing the pyrolysis of HFE, a method of decreasing the dissolved oxygen within HFE and removing the oxygen from the inside of the processing chamber will be investigated. First, as a method of decreasing the dissolved oxygen within the processing liquid, for example, the liquid of the fluorine compound is filled into a sealable chamber, and inert gas is introduced and bubbled within the liquid, so that the oxygen dissolved within the liquid is discharged. The time for the bubbling is, for example, from five to ten minutes, and by sealing and pressurizing the chamber so as to prevent the introduction of the outside oxygen (air), it is possible to decrease the concentration of the dissolved to oxygen. While nitrogen, helium, argon, etc. can be used as the inert gas used for the bubbling, argon has a large specific gravity in comparison with oxygen so that argon may be used for a better oxygen substitution efficiency, and nitrogen gas may be used for a lower cost.

Further, in order to suppress the dissolved oxygen, the sealable chamber is filled with the liquid of the fluorine compound, cooled down to near the melting point, and then vacuum depressurized. The dissolved gas, such as oxygen, is then removed from the system, and the chamber is sealed so as to prevent the introduction of the outside oxygen (air). Further, for example, in the event of the adoption of the construction of an apparatus collecting HFE in an exclusive collection chamber, etc., it is also efficient to decrease the dissolved oxygen within a collected liquid through introducing the inert gas, such as argon, into the collection chamber.

Next, in a method of removing oxygen from a processing atmosphere in which the supercritical processing is performed, a sealed chamber (corresponding to, for example, HFE supply unit 4 of FIG. 3) storing HFE is connected to the processing chamber (corresponding to upper chamber 31 and bottom plate 32 in the present example) of supercritical processing apparatus 3, and inert gas such as nitrogen or argon is introduced into the processing chamber, so as to decrease the concentration of oxygen. Then, wafer W is loaded into the processing chamber, the chamber is sealed, and then HFE is introduced from the sealed chamber to the processing chamber through a pipe. For example, the inert gas maintains its introduced state until the processing chamber is sealed, preventing oxygen from introducing into the processing chamber. After the sealing of the processing chamber, the introduction of nitrogen is stopped and the temperature of the processing chamber is increased up to the critical point, to perform the processing.

Here, the pyrolysis of the fluorine compounds (HFE or HFC) becomes noticeable in the existence of oxygen as described above. Furthermore, the pyrolysis of the fluorine compounds also occurs in the existence of water or alcohol. Especially, when the liquid of the fluorine compound having an easily oxidizable structure is used as a processing liquid for the supercritical processing, the decrease of water or alcohol is important even if it is not as important as the effect of the dissolved oxygen. This is because water or alcohol is the supply sources for a proton (hydrogen ion) so that HF is easily generated.

Especially, the existence of water easily creates the pyrolysis of the fluorine compounds, so that the moisture may be removed from the atmosphere in which the supercritical processing is performed to prevent the introduction of the moisture. Water molecules may be removed because water molecules absorbed to a wafer W to be processed or to an inner wall of the processing chamber along with a high humidity environment serves as a factor creating the pyrolysis of the fluorine compounds. For example, as discussed above, the moisture may be removed by substituting DIW left on the surface of wafer W with IPA or HFE after the liquid processing of wafer W, or by substituting the atmosphere inside of the processing chamber with fully dried air or nitrogen before wafer W is loaded into the processing chamber. Further, the moisture is removed by substituting and purging the atmosphere of the inside of the processing chamber with dry air or nitrogen having a sufficiently low dew point even after the loading of wafer W in the processing chamber. Furthermore, the introduction of outside moisture may be suppressed by making the atmosphere within supercritical processing apparatus 3 including the processing to chamber such as, for example, the atmosphere within a case 38 illustrated in FIG. 2, to have a low humidity.

In the meantime, when the processing chamber is opened to the air in loading/unloading wafer W, moisture may be absorbed to the inner wall of the processing chamber, which becomes a problem when a following wafer W is processed. Therefore, the temperature of wafer W to be processed or the temperature of the inside of the processing chamber may be increased before the liquid of the fluorine compound is introduced for the supercritical processing, thereby suppressing the moisture absorption. Specifically, it is possible to conceive the control of the temperature of the inner wall (top plate, side wall, bottom part, etc.) of the processing chamber or the plate holding unit (disposition board 321 of FIG. 2), so as to suppress the moisture absorption.

Taking the above investigated result into consideration, supercritical processing apparatus 3 according to the present embodiment includes various constructions for (A) reducing the dissolved oxygen within HFE, (B) removing oxygen or moisture from processing space 30 within the processing chamber (upper chamber 31 and bottom plate 32) in which the supercritical processing is performed, and (C) suppressing the moisture absorption to the wall of the processing chamber, so that the pyrolysis of HFE may be suppressed. These constructions correspond to a pyrolysis ingredient removing unit according to the present embodiment. Hereinafter, a specific construction of the pyrolysis ingredient removing unit will be described.

A bubbling unit 41, serving as the pyrolysis ingredient removing unit for reducing the dissolved oxygen within HFE according to construction (A) as described above, for removing the dissolved oxygen from HFE stored in HFE supply unit 4 is to installed in HFE supply unit 4. Bubbling unit 41 is formed with, for example, an exhaust pipe including multiple small holes formed at the wall of a round pipe, and is connected to an inert gas supply line 411 for supplying the inert gas (nitrogen gas in the present example).

The nitrogen gas supplied from inert gas supply line 411 is scattered and supplied into HFE in the inside of HFE supply unit 4 through bubbling unit 41. In this respect, the dissolved oxygen within the vapor of the nitrogen gas in HFE is diffused, so that the dissolved oxygen is removed. Reference number 412 of FIG. 3 denotes an exhaust line 412 for exhausting the nitrogen gas after the bubbling from HFE supply unit 4.

Further, supercritical processing apparatus 3 includes a mechanism, serving as the pyrolysis ingredient removing unit for removing oxygen or moisture from processing space 30 disposed within the processing chamber (upper chamber 31 and bottom plate 32) according to construction (B) as described above, for supplying inert gas to processing space 30 during a period in which HFE is not supplied to processing space 30. For example, HFE supply channel 311 supplying HFE to processing space 30 is switchably connected to an inert gas line 45 for supplying the inert gas to processing space 30 and to aforementioned HFE supply line 42, through a switching valve 422 installed in an upstream side of blocking valve 421.

A high-purity nitrogen gas, which has a dew point controlled to be equal to or lower than −50° C., for example, −60° C., and contains oxygen at a level equivalent to about several sub ppm, can be supplied to inert gas line 45 and can be then supplied to processing space 30. The reason of supplying the inert gas to processing space 30 in a heated state is to maintain the heated state of upper chamber 31 or disposition board 321 to that has been heated by heaters 314 and 322, as described later. Further, since the supplied nitrogen gas serving as the inert gas should include moisture as little as possible, it is not necessary to specially set the lowest limit of the dew point, and the inert gas supplied to processing space 30 is discharged to discharge line 44 through, for example, discharge channel 313.

Next, supercritical processing apparatus 3 has a function, serving as the pyrolysis ingredient removing unit for suppressing the moisture absorption to the wall surface of the processing chamber according to the construction (C) as described above, for heating a member constituting upper chamber 31 and disposition board 321 even during a period in which the supercritical processing is not performed. In supercritical processing apparatus 3 according to the present example, for example, with respect to upper chamber 31, it is possible to heat disposition board 321 by using aforementioned heater 322 installed within bottom plate 32.

In the meantime, heater 314 including, for example, the resistant heating element is embedded in upper chamber 31 and as illustrated in FIG. 3, and upper chamber 31 may be heated by heater 314 that emits heat by power supplied from power unit 6. Further, as described above, a heater 452, in which, for example, a resistant heating element is wound, is installed in inert gas line 45 that supplies the inert gas, so that it is possible to heat the surface of upper chamber 31 or disposition board 321 by heating the inert gas (nitrogen gas) to, for example, 100° C. and introducing heat energy into processing space 30.

While each of aforementioned heaters 322, 314, and 452 corresponds to a heating unit of the processing chamber (upper chamber 31 and bottom plate 32), it is not necessary to install all of three heaters 322, 314, and 452 for heating upper chamber to 31 and disposition board 321 forming processing space 30. For example, it is possible to heat upper chamber 31 and disposition board 321 by using any one or two heaters among heaters 322, 314, and 452.

Further, as illustrated in FIG. 2, inert gas supply chamber 39 for passing the inert gas through case 38 is installed in a ceiling part of case 38 storing upper chamber 31 and bottom plate 32. Inert gas supply chamber 39 includes one pyrolysis ingredient removing unit, such as the pyrolysis ingredient unit according to the construction (B) as described above, for removing oxygen or moisture from processing space 30. For example, the nitrogen gas of which the dew point is controlled to be equal to or lower than −50° C., for example, −60° C., is supplied to inert gas supply chamber 39.

The inert gas supplied to inert gas supply chamber 39 is supplied to case 38 through plural air supply holes 391 formed at the ceiling surface of case 38, so that for example, the inert gas is exhausted from an exhaust unit 383 installed at the side wall of the lower side of case 38. Through the construction, a down flow of the inert gas is formed within case 38 flowing from the upper side to the lower side of case 38, so that, for example, when bottom plate 32 descends to a transfer position to open processing space 30 while wafer W is loaded and unloaded, it is possible to suppress the introduction of oxygen or moisture into processing space 30.

Supercritical processing apparatus 3 including the aforementioned construction is connected to a controller 7 as illustrated in FIGS. 2 and 3. Controller 7 includes a computer equipped with a CPU (not shown) and a memory unit (not shown), and the memory unit records a program including programmed step (command) groups related to the control of the operations of supercritical processing apparatus 3 such as to the operations from loading wafer W into supercritical processing apparatus 3, performing the supercritical processing by using HFE, and to unloading wafer W.

Further, controller 7 records a program for enabling controller 7 to control a first gas supply unit (switching valve 422, etc.) for removing oxygen or moisture from processing space 30 and supplying the inert gas to processing space 30 for a predetermined period time, and for enabling controller 7 to control the heating unit (heaters 322, 314, and 452) of the processing chamber (upper chamber 31 and bottom plate 32) to heat upper chamber 31 and disposition board 321 for a predetermined period of time. Each of the programs is stored in a memory medium, such as hard disk, compact disk, magneto-optical disk, or memory card, and is installed in a computer from the memory medium.

Figure 4:
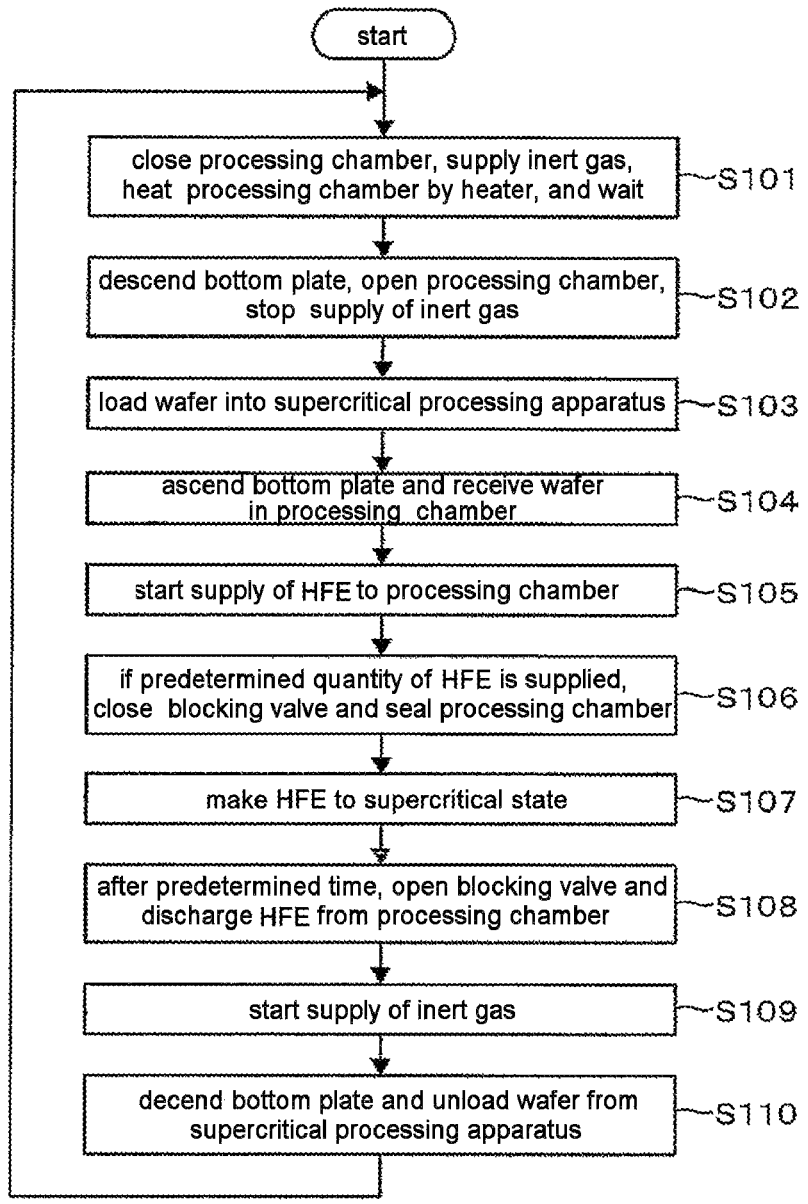
FIG. 4 is a flowchart illustrating an operation executed by the supercritical processing apparatus.
Figure 7:
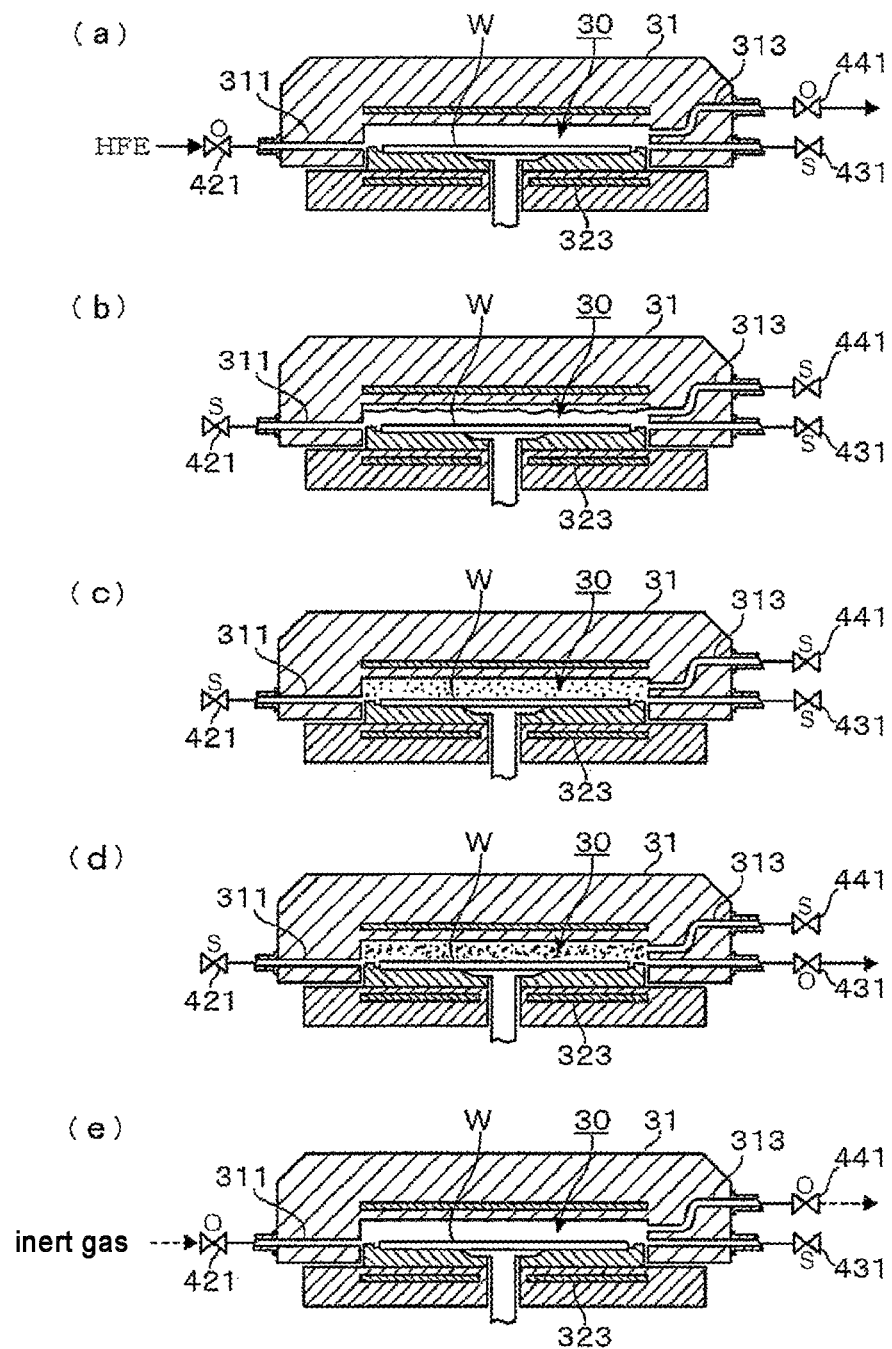
FIG. 7 is a view illustrating contents of a supercritical processing performed by the supercritical processing apparatus.

Hereinafter, the operation of supercritical processing apparatus 3 will be described with reference to the flowchart of FIG. 4 along with each operational explanation view of FIGS. 5 to 7. First, when the operation of supercritical processing apparatus 3 begins, inert gas is supplied into processing space 30 via inert gas line 45 in a closed state of processing space 30. Further, each of heaters 322, 314, and 452 is turned ON and the temperature of upper chamber 31 and disposition board 321 is adjusted to, for example, 100° C., based on a temperature detection result detected from a temperature detector (not shown), and then waits for a next operation (step S101 of FIG. 5A).

By supplying the inert gas to processing space 30 in the closed state, oxygen and moisture existing within processing space 30 are removed, and by heating upper chamber 31 or disposition board 321, moisture absorbed to upper chamber 31 or disposition board 321 is separated, so that the atmosphere, in which the ingredient to facilitating the pyrolysis of HFE within processing space 30 is removed, is formed. Further, each of FIGS. 5 to 7 omits the description of inert gas supply chamber 39, but the inert gas is supplied from inert gas supply chamber 39 through gas supply hole 391, so that the down flow of the inert gas is always formed within case 38.

Wafer W, after completing the liquid processing in cleaning apparatus 2 and then coated with HFE, is loaded into supercritical processing apparatus 3 in a standby state through a loading/unloading port 382 installed in a side surface of case 38. Supercritical processing apparatus 3, as illustrated in FIG. 5B, moves bottom plate 32 up to the lower transfer position, interrupts blocking valve 421, and stops the supply of the inert gas from inert gas line 45 (step S102). At this time, supporting member 331 of supporting mechanism 33 descends in accordance with the movement of bottom plate 32, and lifter 361 is operated such that the upper surface of wafer holding unit 363 is positioned under a carrying route of wafer W. Further, in FIGS. 5A to 6B, only one pair of supporting mechanism 33 and one pair of guide member 34 are illustrated for convenience of the description.

When wafer W disposed on a carrying arm 82 of the outside carrying apparatus is loaded into supercritical processing apparatus 3, and the center part of wafer W reaches the upper side of lifter 361, lifter 361 ascends to cross with carrying arm 82, and carrying arm 82 is discharged to an outside of case 38 while wafer W is held on wafer holding unit 363, as illustrated in FIG. 6A (step S103). Further, as illustrated in FIG. 6B, bottom plate 32 ascends while being guided by guide member 34, and wafer holding unit 363 of lifter 361 is stored within the concave portion of disposition board 321. Wafer W is then arranged on disposition board 321, and received within processing space 30 by combining disposition board 321 with the to opening portion of upper chamber 31 (step S104). At this time, supporting member 331 of supporting mechanism 33 ascends in accordance with the movement of bottom plate 32, so as to support and fix the bottom surface of bottom plate 32.

Even when the supply of the inert gas into processing space 30 is interrupted and wafer W is loaded into processing space 30 by opening processing space 30 as described above, the down flow of the inert gas is formed within case 38, so that oxygen or moisture rarely enters into processing space 30 from case 38 and a state is maintained in which the ingredient facilitating the pyrolysis of HFE within processing space 30 is removed. The interruption of the supply of the inert gas from inert gas line 45 when loading wafer W is for the purpose of directly spraying the heated inert gas to wafer W and preventing HFE coated on the surface of wafer W from being dried. However, the timing for supply and interruption of the inert gas to processing space 30 can be variously changed as described later.

Further, as illustrated in FIG. 7A, switching valve 422 is switched to HFE supply line 42, and blocking valves 421 and 441 of HFE supply channel 311 and discharge channel 313 are switched to "OPEN" (indicated as "O" in FIG. 7A), the supply of HFE from HFE supply channel 311 to processing space 30 begins, and the atmosphere within processing space 30 is discharged to discharge channel 313, so that the atmosphere within processing space 30 is substituted with HFE (step S105).

When a predetermined amount (e.g., about 80% of the volume of processing space 30) of HFE is supplied to processing space 30, blocking valves 421, 431, and 441 of HFE supply channel 311, HFE discharge channel 312, and discharge channel 313 are shifted to "STOP" (indicated as "S" in FIG. 7B), so as to seal processing space 30 (step S106). Then, when the output of heater 322 of bottom plate 32 increases such that the temperature within processing space 30 becomes, for example, 200° C., HFE is heated within sealed processing space 30 and expanded, so that the pressure of the inside of processing space 30 is raised up to, for example, 3 MPa, finally resulting in the supercritical state of HFE (FIG. 7C, step S107).

In accordance with the achievement of the supercritical state of HFE, the supercritical processing in which the liquid on the surface of wafer W is changed to a supercritical fluid state and a supercritical process is performed to dry wafer W. In the state change to the supercritical fluid from the liquid, an interface is not formed between the liquid and the supercritical fluid, so that the capillary force is not applied to pattern 11 on wafer W, thereby drying wafer W without the generation of the pattern collapse. Further, as the dissolved oxygen is removed by the bubbling, HFE itself has a high thermostability, and oxygen or moisture rarely exists in processing space 30 as described above, and HFE used in the supercritical processing is in a state in which the facilitation of the pyrolysis of HFE is difficult, so that the fluorine atoms are rarely discharged from HFE during the supercritical processing. Therefore, it is possible to dry wafer W while preventing a film, such as $SiO_2$ film 12, formed on the surface of wafer W from being etched or the fluorine atoms from being injected into the semiconductor device, such as wafer W or pattern 11.

Then, after a predetermined time elapses, as illustrated in FIG. 7D, blocking valve 431 of HFE discharge channel 312 is switched to "OPEN" so that HFE is discharged from processing space 30 (step S108). HFE discharged to HFE collection line 43 is cooled in cooling unit 432 and collected in HFE supply unit 4. Through the operation, the processing space 30 is depressurized, and when the inside pressure is approximately identical to air pressure, blocking valve 431 of HFE discharge channel 312 is switched to "STOP". Further, blocking valves 421 and 441 of HFE supply channel 311 and discharge channel 313 are switched to "OPEN" as illustrated in FIG. 7E, and switching valve 422 is switched, so that the supply of the inert gas from inert gas line 45 begins (step S109). HFE left within processing space 30 is collected in gas collection unit 442 installed at discharge line 44.

Next, bottom plate 32 descends, processing space 30 is opened, and then wafer W is unloaded from supercritical processing apparatus 3 in a route contrary to that in loading in wafer W, completing a series of operations (step S110). Then, when wafer W is unloaded, bottom plate 32 ascends and processing space 30 is closed. Then, the output of each heater 322 is adjusted such that the temperature of upper chamber 31 and disposition board 321 becomes 100° C., and supercritical processing apparatus 3 waits for loading of next wafer W (step S101).

Supercritical processing apparatus 3 according to the present embodiment has following effects. The supercritical processing is performed under the condition where the pyrolysis of HFE is difficult by removing the ingredient that facilitates the pyrolysis of HFE from the processing chamber (upper chamber 31 and bottom plate 32) before the supercritical processing begins, removing the dissolved oxygen within HFE, and using HFE having a property that the pyrolysis of HFE is difficult. Therefore, the generation of the pattern collapse of pattern 11 formed on the surface of wafer W and the injection of the fluorine atoms constituting HFE into wafer W are suppressed, thereby achieving a high-quality processing result.

If at least one or more of the pyrolysis ingredient removing units of aforementioned (A) to (C) is included, it is possible obtain the effect of the present disclosure in accordance with a removal capability of the ingredient facilitating the to pyrolysis of HFE by the pyrolysis ingredient removing unit. However, especially, it is effective to decrease the dissolved oxygen within HFE by the pyrolysis ingredient removing unit according to the construction (A), and to remove oxygen or moisture within processing space 30 by the pyrolysis ingredient removing unit according to the construction (B) as described above.

Here, in the description of the operation with reference to FIGS. 4 to 7, as schematically illustrated in FIG. 8A, there is described the example in which HFE is discharged to HFE collection line 43 from processing space 30 and the inside pressure is decreased. Then, the inert gas is supplied to processing space 30 during the time frame before a following wafer W is loaded, thereby forming the atmosphere in which the ingredient of the pyrolysis of HFE within processing space 30 is removed. However, the time for supply of the inert gas is not limited thereto. In FIGS. 8A, 8B, 9A, and 9B to be described below, the uppermost row represents the change of the atmosphere within processing space 30 in the rightward direction along the time axis, and the second column represents the atmosphere of case 38. The lower side of the two columns represent an open/closed state (a state in which bottom plate 32 descends is referred to as "OPEN", and a state, in which bottom plate 32 ascends and processing space 30 is sealed, is referred to as "CLOSE") of processing space 30 corresponding to each timing, and an open/closed state of each of blocking valves 421, 441, and 431 of a switching position of switching valve 422 in the side of HFE supply channel 311, the side of HFE supply channel 311, the side of discharge line 44 (discharge channel 313), and the side of the HFE collection line (HFE discharge channel 312).

For example, as illustrated in FIG. 8B, it is acceptable to supply the inert gas to processing space 30 only during the loading and unloading operation of wafer W. In the example illustrated in FIG. 8B, processing space 30 opened for unloading wafer W maintains its opened state until following wafer W is loaded. However, for example, processing space 30 may be closed after unloading wafer W and supply the inert gas to processing space 30 only for a time period while wafer W is loaded during which processing space 30 is opened, so as to prevent the entrance of oxygen or moisture from the outside. In each of FIGS. 8B, 9A, and 9B, the indication of a column representing the atmosphere within case 38 is omitted. However, similar to a case of FIG. 8A, it is acceptable to form the down flow of the inert gas within case 38. Further, when the atmosphere within processing space 30 is substituted by the inert gas after wafer W is loaded as in the present example, the quantity of used nitrogen gas may be reduced by removing only the moisture from the down flow formed within case 28 by a dry air having a dew point of, for example, −50° C. or lower. Alternatively, the atmosphere within case 38 may be replaced by a typical atmosphere.

Further, as illustrated in FIG. 9A, processing space 30 may be closed after wafer W is loaded, and then, HFE may be supplied after a sufficient amount of inert gas is supplied for a short time period for discharging oxygen or moisture existing within processing space 30. As such, if the conditions that (1) the ingredient facilitating the pyrolysis of HFE has been removed from processing space 30 before the introduction of HFE begins, and (2) HFE on the surface of wafer W is not dried before the start of the introduction of HFE, are satisfied, it is possible to obtain the effect of the present disclosure.

Therefore, as illustrated in FIG. 9B, the inert gas may be continuously supplied to processing space 30 for a time period after discharging HFE within processing space 30 before the start of supplying HFE for a next processing. When the to down flow of the inert gas is formed in the side of case 38, the above continuous supply of the inert gas is more effective because the inert gas is introduced into processing space 30 from case 38 while processing space 30 is opened and wafer W is loaded.

Further, with respect to a time for heating upper chamber 31 and disposition board 321 by each of heaters 322, 314, and 452, similar to the supply time of the inert gas, if the conditions that (1) processing space 30 is sealed after the completion of the loading of wafer W and the ingredient facilitating the pyrolysis of HFE has been removed in processing pace 30 before the start of the introduction of HFE and (2) HFE on the surface of wafer W is not dried before the start of the introduction of HFE, are satisfied, it is possible to obtain the effect of the present disclosure.

At this time, in order to prevent the moisture separated from upper chamber 31 and disposition board 321 from staying within processing space 30, a purge gas supply unit may be installed for passing purge gas through the inside of processing space 30, either simultaneously with or after heating upper chamber 31 and disposition board 321, and the separated moisture may be discharged by the purge gas. While the purge gas used for discharging the moisture may have a low moisture content, other gas of which the dew point is adjusted by −50° C. or less, may be used as well.

In addition, the supply of the inert gas to the processing chamber (upper chamber 31 and bottom plate 32) is not limited to a case in which processing space 30 is closed. For example, the inert gas may be supplied in a state where bottom plate 32 descends, and processing space 30 is opened. In order to form the atmosphere in which the ingredient facilitating the pyrolysis of HFE within processing space 30 is removed, supercritical processing apparatus 3 is not limited to a case in which all of the constructions, for supplying the inert gas to processing space 30, heating upper chamber to 31 and disposition board 321, and supplying the inert gas from inert gas supply chamber 39 to case 38, are included serving as a dry atmosphere forming unit. The dry atmosphere may be formed by using only one construction or a combination of two constructions among the constructions.

In the aforementioned various embodiments, while HFE is adopted as the processing liquid that includes the fluorine compound for the supercritical processing for wafer W, the processing liquid adoptable in the present disclosure is not limited to HFE. For example, HFC can be used as the processing liquid including the fluorine compound. In this case, by using supercritical processing apparatus 3 including the pyrolysis ingredient removing unit for (A) decreasing the dissolved oxygen within HFC, (B) removing oxygen or moisture within processing space 30 in which the supercritical processing is performed, and (C) suppressing the moisture absorption to the wall surface of the processing chamber, it is also possible to dry wafer W while suppressing the pyrolysis of HFC to suppress the introduction of the fluorine atoms into wafer W.

EXAMPLARY EMBODIMENTS (Experiment 1) The pyrolysis property of HFE was investigated under the existence of activated carbon used in gas collection unit 442.

A. Experimental Condition

Embodiment 1-1

$CF_3CH_2OCF_2CHF_2$ (1,1,2,2-tetrafluoro-1-(2,2,2-trifluoroethoxy)ethane) illustrated in FIG. 10A was heated for 72 hours in the presence of the activated carbon, and under conditions of 120° C. and an atmospheric pressure. And, the concentration of fluorine ions emitted from HFE and the concentration of acid contents were measured.

Embodiment 1-2

$CF_3CH_2OCF_2CHFCF_3$ (1,1,2,3,3,3-hexafluoro-1-(2,2,2-trifluoroethoxy)propane) illustrated in FIG. 10B was heated with the identical condition to (Embodiment 1-1), and the concentration of fluorine ions and the concentration of acid contents were measured.

Embodiment 1-3

$CF_3CHFCF_2OCH_2CF_2CF_3$ (2,2,3,3,3-pentafluoro-1-(1,1,2,3,3,3-hexafluoropropoxy)propane) illustrated in FIG. 10C was heated with the identical condition to (Embodiment 1-1), and the concentration of fluorine ions and the concentration of acid contents were measured.

Comparative Example 1-1

$(CF_3)_2CFCF_2OCH_3$ (1,1,2,3,3,3-hexafluoro-1-methoxy-2-trifluoromethylpropane) illustrated in FIG. 11A was heated with the identical condition to (Embodiment 1-1), and the concentration of fluorine ions and the concentration of acid contents were measured.

Comparative Example 1-2

$(CF_3)_2CFCF_2OCH_2CH_3$ (1,1,2,3,3,3-hexafluoro-1-ethoxy-2-trifluoromethylpropane) illustrated in FIG. 11B was heated with the identical condition to (Embodiment 1-1), and the concentration of fluorine ions and the concentration of acid contents were measured.

Comparative Example 1-3

$(CF_3)_2CFCF(OCH_3)CF_2CF_3$ (1,1,1,2,3,4,4,5,5,5-decafluoro-2-trifluoromethyl-3-methoxypentane) illustrated in FIG. 11C was heated with the identical condition to (Embodiment 1-1), and the concentration of fluorine ions and the concentration of acid contents were measured.

B. Experimental Result

Even if HFE in each of (Embodiment 1-1) to (Embodiment 1-3) was subjected to the heating processing under the existence of the activated carbon, the fluorine ion and the acid content were equal to or less than a detection limit (0.02 ppm of fluorine ion, 1 ppm of acid content). In the meantime, in (Comparative example 1-1), the measured concentration of fluorine ions and the measured acid content were 45 ppm and 160 ppm, respectively, and also in (Comparative example 1-2) and (Comparative example 1-3), the measured concentration of fluorine and the measured acid content were similar to those of (Comparative example 1-1). Therefore, it appears that, under the existence of the activated carbon, HFE according to each of the embodiments had a high thermo-stability, and HFE according to the comparative examples had a low thermo-stability as compared to HFE according to the embodiments.

(Experiment 2) The supercritical processing were performed for removing the liquid after the liquid processing from wafer W on which various patterns 11 by using HFE according to (Embodiment 1-1), and the generation of the pattern collapse was identified.

A. Experimental Condition

Embodiment 2-1

The supercritical processing was performed on wafer W including a silicon oxide film, on which the MEMS having a cantilever structure was formed, after the liquid processing of wafer W.

Embodiment 2-2

The supercritical processing was performed on wafer W in which fine pattern 11 was formed on a silicon oxide film, after the liquid processing.

Embodiment 2-3

The supercritical processing was performed on wafer W in which pattern 11 was formed on a porous silicon oxide film having fine holes, after the liquid processing.

B. Experimental Result

As a result of expansive investigation of wafer W in each of (Embodiment 2-1) to (Embodiment 2-3), it could be identified that the supercritical processing was being performed without the generation of the pattern collapse or the damage of the fine holes to of the porous oxide film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A supercritical processing method, comprising the steps of:
    loading a substrate formed with a pattern into a processing chamber where the substrate is processed by a processing liquid and by a supercritical liquid including a fluorine compound;
    removing an ingredient facilitating a pyrolysis of the fluorine compound of the supercritical liquid both from the processing chamber and from the supercritical liquid;
    supplying the supercritical liquid including the fluorine compound from which the ingredient facilitating the pyrolysis of the fluorine is removed to the processing chamber where the substrate is received;
    sealing the processing chamber and performing a supercritical processing for the substrate with a supercritical condition obtained by heating the supercritical liquid including the fluorine compound from which the ingredient facilitating the pyrolysis of the fluorine is removed; and
    discharging the supercritical liquid from the processing chamber after completing the supercritical processing,
    wherein the removing of the ingredient from the processing chamber is performed in a closed state of the processing chamber prior to the loading of the substrate into the processing chamber and the removing of the ingredient from the supercritical liquid is performed prior to the supplying of the supercritical liquid to the processing chamber, and
    wherein the fluorine compound is hydrofluoro ether or hydrofluoro carbon.

2. The supercritical processing method as claimed in claim 1, wherein the removing step further comprises supplying inert gas to a storage unit provided independently from the processing chamber to store the supercritical liquid and to perform a bubbling process in the storage unit before supplying the supercritical liquid to the processing chamber.

3. The supercritical processing method as claimed in claim 1, wherein the removing step further comprises supplying inert gas to the processing chamber.

4. The supercritical processing method as claimed in claim 1, wherein the fluorine compound is hydrofluoro ether consisting of a fluoroalkyl group including one or fewer carbon-carbon bond of a carbon atom positioned at α location, and two or fewer carbon-carbon bonds of a carbon atom positioned at β location, when viewed from an oxygen atom.

5. The supercritical processing method as claimed in claim 3, further comprising supplying the inert gas to the processing chamber before the processing chamber is sealed after the substrate is loaded into the processing chamber, in order to remove the ingredient facilitating the pyrolysis of the fluorine compound of the supercritical liquid from the processing chamber.

6. The supercritical processing method as claimed in claim 3, further comprising supplying the inert gas to the processing chamber after the substrate is loaded into the processing chamber, in order to remove the ingredient facilitating the pyrolysis of the fluorine compound of the supercritical liquid from the processing chamber.

7. The supercritical processing method as claimed in claim 3, wherein the processing chamber is received within a case in which the substrate is loaded and unloaded through a loading/unloading port, and further comprises supplying the inert gas to the case while the processing chamber is in an open state, in order to remove the ingredient facilitating the pyrolysis of the fluorine compound of the processing liquid from an atmosphere surrounding the processing chamber.

8. The supercritical processing method as claimed in claim 3, wherein the inert gas is nitrogen gas having a dew point of −50° C. or lower.

9. The supercritical processing method as claimed in claim 4, wherein the fluorine compound includes at least one hydrofluoro ether selected from the group consisting of 1,1,2,2-tetrafluoro-1-(2,2,2-trifluoroethoxy)ethane, 1,1,2,3,3,3-hexafluoro-1-(2,2,2-trifluoroethoxy)propane, and 2,2,3,3,3-pentafluoro-1-(1,1,2,3,3,3-hexafluoropropoxy)propane.

* * * * *